United States Patent
Fu et al.

(10) Patent No.: US 9,933,652 B2
(45) Date of Patent: Apr. 3, 2018

(54) COLOR FILTER ARRAY SUBSTRATE AND MANUFACTURING METHOD THEREOF, AND DISPLAY DEVICE

(71) Applicant: Shenzhen China Star Optoelectronics Technology Co., Ltd., Shenzhen, Guangdong (CN)

(72) Inventors: Ruhai Fu, Guangdong (CN); Yung-Iun Lin, Guangdong (CN); Chun-kai Chang, Guangdong (CN); Jie Qiu, Guangdong (CN); Chengliang Ye, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 148 days.

(21) Appl. No.: 14/787,064

(22) PCT Filed: Sep. 30, 2015

(86) PCT No.: PCT/CN2015/091196
§ 371 (c)(1),
(2) Date: Oct. 26, 2015

(87) PCT Pub. No.: WO2017/049663
PCT Pub. Date: Mar. 30, 2017

(65) Prior Publication Data
US 2017/0255053 A1 Sep. 7, 2017

(30) Foreign Application Priority Data

Sep. 25, 2015 (CN) .......................... 2015 1 0622182

(51) Int. Cl.
*H01L 29/15* (2006.01)
*G02F 1/1335* (2006.01)
(Continued)

(52) U.S. Cl.
CPC ...... *G02F 1/133514* (2013.01); *G02F 1/1368* (2013.01); *G02F 1/13439* (2013.01);
(Continued)

(58) Field of Classification Search
CPC ......... G02F 1/133514; G02F 1/133345; G02F 1/133512; G02F 1/133516;
(Continued)

(56) References Cited

U.S. PATENT DOCUMENTS

2002/0074549 A1* 6/2002 Park .................... G02F 1/13458
257/59
2005/0128399 A1* 6/2005 Kim .................. G02F 1/134336
349/129

(Continued)

FOREIGN PATENT DOCUMENTS

| CN | 1584691 A | 2/2005 |
| CN | 101162337 A | 4/2008 |
| CN | 203502701 U | 3/2014 |
| CN | 104765192 A | 7/2015 |

*Primary Examiner* — Tu-Tu Ho
(74) *Attorney, Agent, or Firm* — Andrew C. Cheng

(57) ABSTRACT

The invention provides a color filter array substrate and a manufacturing method thereof, and a display device. Multiple pixel units arranged in an array are formed on a base of the color filter array substrate, and each pixel unit includes a transparent region and an opaque region located at the periphery of the transparent region, the pixel unit further includes a color filter pattern and a black matrix pattern. The color filter pattern covers the transparent region, and the black matrix pattern directly covers the opaque region in the case of the color filter pattern being not disposed therebelow. Compared with the prior art, the invention can form a thicker black matrix pattern in the opaque region of the pixel unit to thereby prevent the light leakage problem, so that subsequent display quality can be improved.

14 Claims, 4 Drawing Sheets

(51) Int. Cl.
  *G02F 1/1368* (2006.01)
  *G02F 1/1362* (2006.01)
  *G02F 1/1333* (2006.01)
  *G02F 1/1343* (2006.01)
  *H01L 27/12* (2006.01)

(52) U.S. Cl.
  CPC .. *G02F 1/133345* (2013.01); *G02F 1/133512* (2013.01); *G02F 1/133516* (2013.01); *G02F 1/134309* (2013.01); *G02F 1/136227* (2013.01); *G02F 1/136286* (2013.01); *G02F 2001/136295* (2013.01); *G02F 2201/123* (2013.01); *H01L 27/1248* (2013.01)

(58) Field of Classification Search
  CPC ........... G02F 1/134309; G02F 1/13439; G02F 1/136227; G02F 1/136286; G02F 1/1368; G02F 2001/136295; G02F 2201/123; H01L 27/1248
  USPC ......................................................... 257/72
  See application file for complete search history.

(56) References Cited

U.S. PATENT DOCUMENTS

2015/0029428 A1   1/2015  Wang et al.
2016/0225347 A1*  8/2016  Haruyama ............ G02F 1/1337

* cited by examiner

COLOR FILTER ARRAY SUBSTRATE AND MANUFACTURING METHOD THEREOF, AND DISPLAY DEVICE

TECHNICAL FIELD

The invention relates to the field of display technology, and particularly to a color filter array substrate and a manufacturing method thereof, and a display device.

DESCRIPTION OF RELATED ART

With people's demands of high, precise and fine quality for liquid crystal display products getting higher and higher, precision requirements of alignment and bonding of an array substrate with a color filter substrate of a liquid crystal display screen for a production line become higher and higher. The traditional alignment and bonding process cannot meet the high precision requirements, and thus a color filter array substrate technology of preparing a color filter film on an array substrate so as to increase alignment accuracy and aperture ratio has been gradually developed.

The color filter array substrate technology is that a color filter film and a black matrix are directly formed/manufactured on an array substrate, which makes the alignment precision requirement of pixel electrodes with the color filter film as well as black matrix be greatly reduced, so that the aperture ratio of pixel unit can be greatly improved and thereby the purposes of improving light transmittance and contrast can be achieved. In the prior art, the color filter film of the color filter array substrate covers the entire pixel unit, i.e., covers a transparent region and an opaque region (or routing region) of the pixel unit, and further the black matrix is disposed on regions corresponding to a thin film transistor, a scan line, a data line and so forth so as to prevent light leakage in the opaque region. A drain electrode of the thin film transistor is needed to electrically connect with the pixel electrode above the black matrix and the color filter film, the black matrix and color filter film corresponding to a connected position of the drain electrode usually are dug to form through holes, and then the pixel electrode is electrically connected to the drain electrode via the through holes. However, owing to a low light density of the black matrix material, a very thick black matrix material layer is required to be coated so as to effectively prevent the light leakage problem, since the black matrix material has a certain flowability, some of which would flow into the through holes or other low-lying region. For example, it flows from a display region with the color filter film of the color filter array substrate to an non-display region without the color filter film and located at an edge of the color filter array substrate, which would result in that the black matrix on the color filter film of the opaque region becomes thin, the light leakage problem is occurred and consequently the display quality is degraded.

Therefore, there is a light leakage problem resulting from the black matrix being thinned would be occurred in the opaque region of pixel unit associated with the prior art, which would cause an adverse effect to subsequent display quality.

SUMMARY

A technical problem to be solved by the invention is to provide a color filter array substrate and a manufacture method thereof and a display device, so as to form a thick black matrix pattern in an opaque region of pixel unit to thereby avoid the light leakage problem.

In order to solve the above-mentioned technical problem, a technical solution proposed by the invention is to provide a color filter array substrate. The color filter array substrate includes a base and a plurality of pixel units arranged in an array on the base. Each of the plurality of pixel units includes a transparent region (light-transmissible region) and an opaque region located at the periphery of the transparent region. Each of the plurality of pixel units further includes a color filter pattern and a black matrix pattern. The color filter pattern covers the transparent region, the black array pattern directly covers the opaque region and the color filter pattern is not disposed therebelow.

In one embodiment, the black matrix pattern is made of an organic photoresist material.

In one embodiment, each of the plurality of pixel units further includes a thin film transistor, a scan line pattern, a data line pattern, a first passivation layer and a pixel electrode pattern. A gate electrode pattern and a drain electrode pattern of the thin film transistor respectively are connected with the scan line pattern and the data line pattern. The pixel electrode pattern is located above the first passivation layer. The first passivation layer is disposed with a first through hole, and the drain electrode pattern of the thin film transistor is connected with the pixel electrode pattern by the first through hole. The black matrix pattern is disposed corresponding to the thin film transistor, the scan line pattern and the data line pattern and directly in contact with the first passivation layer.

In one embodiment, the black matrix pattern is disposed on the first passivation layer.

In one embodiment, the black matrix pattern further is disposed with a second through hole at a location thereof corresponding to the first through hole to facilitate the drain electrode pattern of the thin film transistor to be connected with the pixel electrode pattern by the first through hole and the second through hole.

In one embodiment, each of the plurality of pixel units further includes a second passivation layer. The second passivation layer is located between the black matrix pattern and the pixel electrode pattern. The second passivation layer is disposed with a third through hole to facilitate the drain electrode pattern of the thin film transistor to be connected with the pixel electrode pattern by the first through hole, the second through hole and the third through hole.

In one embodiment, the black matrix pattern is disposed between the first passivation layer and the base.

In order to solve the above-mentioned technical problem, another technical solution provided by the invention is to provide a display device. The display device includes a color filter array substrate. The color filter array substrate includes a base and multiple pixel units arranged in an array on the base. Each of the plurality of pixel units includes a transparent region and an opaque region located at the periphery of the transparent region. Each of the plurality of pixel units further includes a color filter pattern and a black matrix pattern. The color filter pattern covers the transparent region, and the black array pattern directly covers the opaque region in the case of no the color filter pattern being disposed therebelow.

In one embodiment, the black matrix pattern is made of an organic photoresist material.

In one embodiment, each of the plurality of pixel units further includes a thin film transistor, a scan line pattern, a data line pattern, a first passivation layer and a pixel electrode pattern. A gate electrode pattern and a drain electrode pattern of the thin film transistor are connected with the scan line pattern and the data line pattern respectively. The pixel electrode pattern is located above the first passivation layer. The first passivation layer is disposed with a first through hole, and the drain electrode pattern of the thin film transistor is connected with the pixel electrode pattern by the first through hole. The black matrix pattern is disposed corresponding to the thin film transistor, the scan line pattern and the data line pattern and directly in contact with the first passivation layer.

In one embodiment, the black matrix pattern is disposed on the first passivation layer.

In one embodiment, the black matrix pattern is disposed between the first passivation layer and the base.

In one embodiment, the black matrix pattern further is disposed with a second through hole at a location thereof corresponding to the first through hole to facilitate the drain electrode pattern of the thin film transistor to be connected with the pixel electrode pattern by the first through hole and the second through hole.

In one embodiment, each of the plurality of pixel units further includes a second passivation layer, and the second passivation layer is located between the black matrix pattern and the pixel electrode pattern. The second passivation layer is disposed with a third through hole to facilitate the drain electrode pattern of the thin film transistor to be connected with the pixel electrode pattern by the first through hole, the second through hole and the third through hole.

In one embodiment, the black matrix pattern is disposed between the first passivation layer and the base.

In order to solve the above-mentioned technical problem, a further another technical solution provided by the invention is to provide a manufacturing method of a color filter array substrate. The manufacturing method includes the following steps of:

providing a base;

sequentially forming a gate electrode pattern of a thin film transistor and a scan line pattern, a gate insulation layer, a semiconductor pattern, a source electrode pattern and a drain electrode pattern of the thin film transistor and a data line pattern on the base;

forming a first passivation layer on the source electrode pattern and the drain electrode pattern of the thin film transistor and the data line pattern;

forming a color filter pattern on the first passivation layer to make the color filter pattern cover a transparent region of the color filter array substrate; and forming a black matrix pattern disposed alternately with the color filter pattern on the first passivation layer to make the black matrix pattern cover an opaque region of the color filter array substrate.

In one embodiment, the manufacturing method further includes:

forming a second passivation layer on the color filter pattern and the black matrix pattern (which are arranged in juxtaposition with each other);

forming through holes respectively at locations of the second passivation layer, the black matrix pattern and the first passivation layer corresponding to the drain electrode pattern;

forming a pixel electrode pattern on the second passivation layer to make the pixel electrode pattern be connected with the drain electrode pattern by the through holes.

Sum up, beneficial effects of the invention can be achieved are that: the invention forms multiple pixel units arranged in an array on the base of the color filter film substrate, each pixel unit includes a transparent region and an opaque region located at the periphery of the transparent region, the pixel unit further includes a color filter pattern and a black matrix pattern, the color filter pattern covers the transparent region, and the black matrix pattern directly covers the opaque region and no color filter pattern is disposed therebelow. Compared with the prior art, the invention can form a thicker black matrix pattern on the opaque region of the pixel unit so as to avoid the light leakage problem, and therefore subsequent display quality can be improved.

DETAILED DESCRIPTION OF EMBODIMENTS

Figure 1:
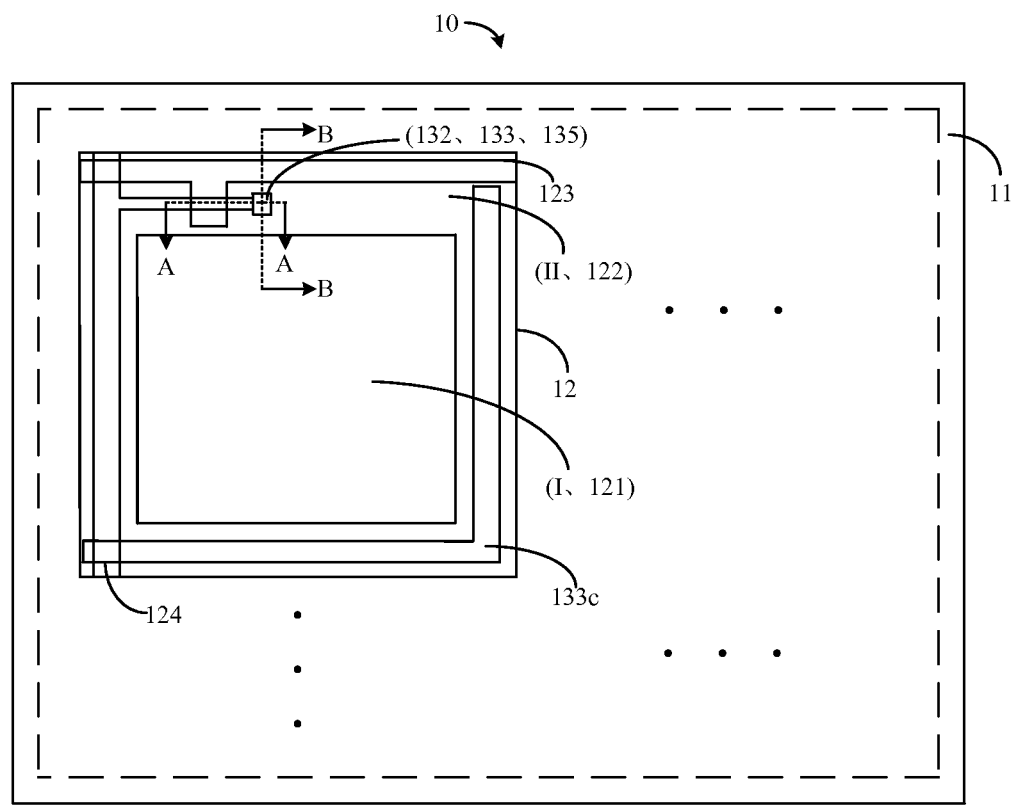
FIG. 1 is a schematic top view of an embodiment of a color filter array substrate provided by the invention.
Figure 2:
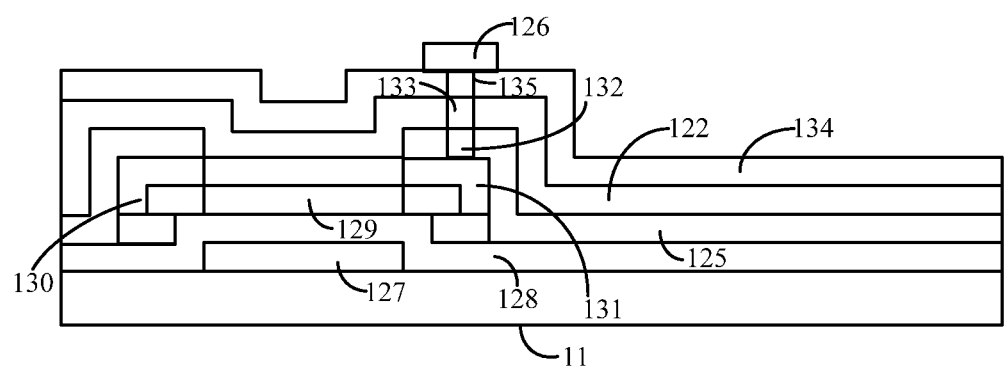
FIG. 2 is a schematic sectional view taken along A-A line in FIG. 1.

Referring to FIG. 1 and FIG. 2 together, FIG. 1 is a schematic top view of an embodiment of a color filter array substrate provided by the invention, and FIG. 2 is a schematic sectional view taken along A-A line in FIG. 1. As shown in FIG. 1 and FIG. 2, the color filter array substrate 10 includes a base 11 and multiple (i.e., more than one) pixel units 12 (FIG. 1 only shows one pixel unit as an example for the purpose of illustration) arranged in an array and formed on the base 11. Each the pixel unit 12 includes a transparent region I and an opaque region II located at the periphery of the transparent region I. The pixel unit 12 further includes a color filter pattern 121 and a black matrix pattern 122. The color filter pattern 121 covers the transparent region I, the black matrix pattern 122 directly covers the opaque region II in the case of no color filter pattern 121 being disposed therebelow.

The transparent region I is a pixel aperture region of the pixel unit 12 and configured (i.e., structured and arranged) for displaying a color image. The opaque region II is a region of electronic components being disposed for driving the transparent region I.

A region of the color filter array substrate 10 in FIG. 1 within the dotted lines is a display region and disposed with multiple pixel units 12 arranged in an array. A region located at the periphery of the display region is a non-display region and configured to be disposed with a driving circuit of the color filter array substrate or a wiring structure for connecting an external driving circuit.

The black matrix pattern 122 of the color filter array substrate 10 is made of an organic photoresist material.

Please continue to refer to FIG. 1 and FIG. 2 together, the pixel unit 12 further includes a thin film transistor, a scan line pattern 123 (not shown in FIG. 2), a data line pattern 124 (not shown in FIG. 2), a first passivation layer 125 (not shown in FIG. 1) and a pixel electrode pattern 126 (not shown in FIG. 1). The thin film transistor includes a gate electrode pattern 127, a gate insulation layer 128, a semiconductor pattern 129, a source electrode pattern 130 and a drain electrode pattern 131 sequentially arranged on the base 11. Concretely, the first passivation layer 125 is disposed on the source electrode pattern 130 and the drain electrode pattern 131; the gate electrode pattern 127 and the source electrode pattern 130 respectively are connected with the scan line pattern 123 and the data line pattern 124; the pixel electrode pattern 126 is located above the first passivation layer 125; the first passivation layer 125 is disposed with a first through hole 132, the drain electrode pattern 131 of the thin film transistor is connected with the pixel electrode pattern 126 by the first through hole 132; the black matrix pattern 122 is disposed corresponding to the thin film transistor, the scan line pattern 123 and the data line pattern 124 and directly in contact with the first passivation layer 125.

The black matrix pattern 122 being disposed corresponding to the thin film transistor, the scan line pattern 123 and the data line pattern 124 means that: the black matrix pattern 122 can fully cover the opaque region II, the thin film transistor, the scan line pattern 123 and data line pattern 124 are disposed in the opaque region II and thus the black matrix pattern 122 can cover the region to make it be non-transparent (i.e., opaque).

It can be understood that, although FIG. 2 illustrates that the black matrix pattern 122 is disposed above the first passivation layer 125, alternatively, the black matrix pattern 122 may be disposed between the first passivation layer 125 and the base 11 instead. As shown in FIG. 2, furthermore, the pixel electrode pattern 126 is located above the black matrix pattern 122, a location of the black matrix pattern 122 corresponding to the first through hole 132 is disposed with a second through hole 133 to facilitate the drain electrode pattern 131 of the thin film transistor to be connected with the pixel electrode pattern 126 by the first through hole 131 and the second through hole 132. It also can be understood that the scan line pattern 123 and the data line pattern 124 shown in FIG. 1 may be located above or below the black matrix pattern 122, and their sizes are less than or equal to the size of the black matrix pattern 122. In other embodiment, the pixel unit 12 optionally further includes a common electrode pattern 133*c*, and the common electrode pattern 133*c* is disposed insulated from the scan line pattern 123 and the data line pattern 124, so as to form a storage capacitor (not shown in FIG. 1 and FIG. 2) of the pixel unit 12.

Please continue to refer to FIG. 2, the pixel unit 12 further includes a second passivation layer 134. The second passivation layer 134 is located/disposed between the black matrix pattern 122 and the pixel electrode pattern 126, the second passivation layer 134 is disposed with a third through hole 135 to facilitate the drain electrode pattern 131 of the thin film transistor to be connected with the pixel electrode pattern 126 via the first through hole 132, the second through hole 133 and the third through hole 135.

The first passivation layer 125, the gate insulation layer 128 and the second passivation layer 134 each are a whole layer structure and therefore are not needed to be patterned by mask process.

In order to meet the requirement of connecting the pixel electrode pattern 126, the regions of the first through hole 131, the second through hole 132 and the third through hole 133 optionally are not covered with black matrix material. That is, the region of the black matrix pattern 122 corresponding to the first through hole 131, the second through hole 132 and the third through hole 133 has no black matrix material.

Figure 3:
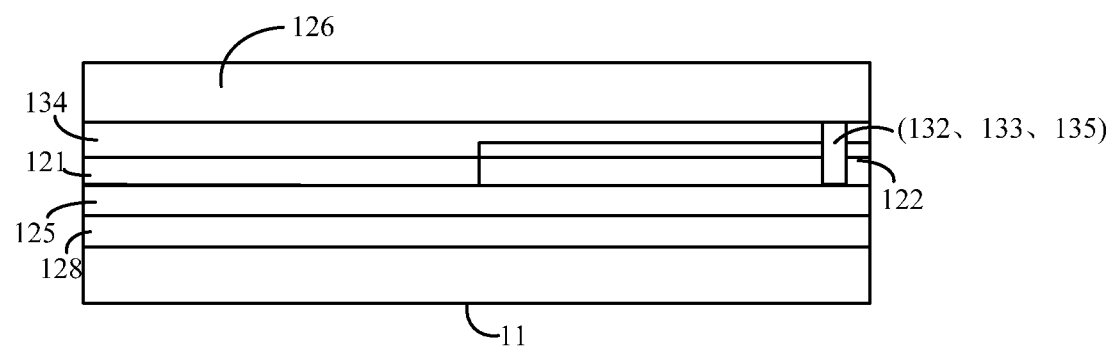
FIG. 3 is a schematic sectional view taken along B-B line in FIG. 1.

Referring to FIG. 3, FIG. 3 is a schematic sectional view taken along B-B line in FIG. 1. As shown in FIG. 3, FIG. 1 and FIG. 2, the color filter pattern 121 is disposed on the first passivation layer 125 of the display region I, it is understood that, the first passivation layer 125 has the gate insulation layer 128 and the base 11 sequentially disposed therebelow, and the first passivation layer 125 further has the pixel electrode pattern 126 disposed thereabove. Furthermore, a second passivation layer 134 is disposed below the pixel electrode pattern 126 and also disposed between the pixel electrode pattern 126 and the color filter pattern 121 as well as the black matrix pattern 122. The color filter pattern 121 and the black matrix pattern 122 are alternately disposed (e.g., the color filter patter 121 and the black matrix pattern 122 are disposed in a form of complementary shapes or approximate complementary shapes). In the non-display region II of the pixel unit 12, it is not disposed with the color filter pattern 121 continuous with the display region I, the black matrix pattern 122 directly covers the whole non-display region II, the black matrix material optionally is not disposed at the locations of through holes such as the first through hole 131, the second through hole 132 and the third through hole 135 (FIG. 3 does not illustrate related components such as the drain electrode pattern 131 below the three through holes, please refer to the illustration of FIG. 2). Because the color filter pattern 121 is not disposed in the non-display region II, a thicker black matrix pattern 121 in the region can be formed compared with the black matrix pattern in the prior art, so that the light leakage occurred in the region can be effectively prevented and meanwhile the light transmission effect in the display region I is not affected, a dark state brightness for subsequent display can be reduced and contrast can be increased and therefore the display quality is improved.

Figure 4:
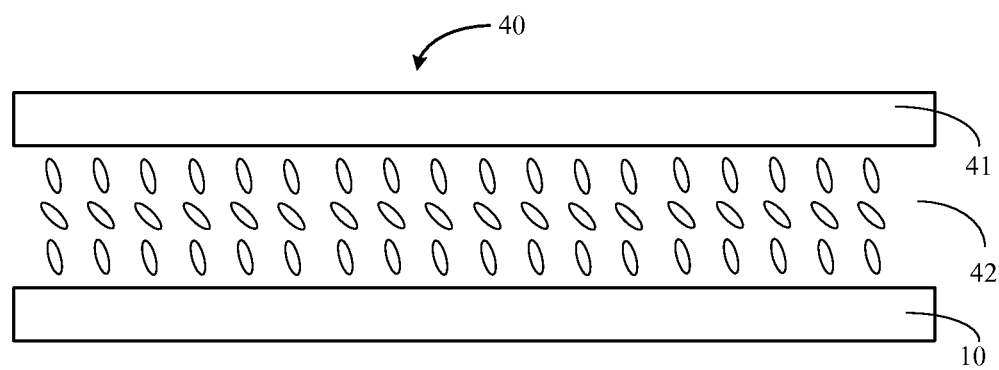
FIG. 4 is a schematic structural view of an embodiment of a display device provided by the invention.

Referring to FIG. 4, FIG. 4 is a schematic structural view of an embodiment of a display device provided by the invention. As illustrated in FIG. 4, the display device 40 includes the color filter array substrate 10 in above-mentioned embodiment, a color filter substrate 41 and a liquid crystal layer 42 located between the color filter array substrate 10 and the color filter substrate 41. Since the display device 40 includes the color filter array substrate 10 as shown in FIG. 1, FIG. 2 and FIG. 3, and the color filter array substrate 10 includes the color filter pattern 121 and the black matrix pattern 122, so that the color filter substrate 41 has no need of disposing another color filter pattern and another black matrix pattern, the black matrix pattern 122 of the color filter array substrate 10 directly covers the non-display region II of the pixel unit 12 in the case of no color filter pattern 122 being disposed therebelow, so that a thicker black matrix pattern can be formed in the region compared with the black matrix pattern in the prior art, which can effectively prevent from the light leakage of the region and meanwhile does not affect the light transmission effect in the display region I.

Figure 5:
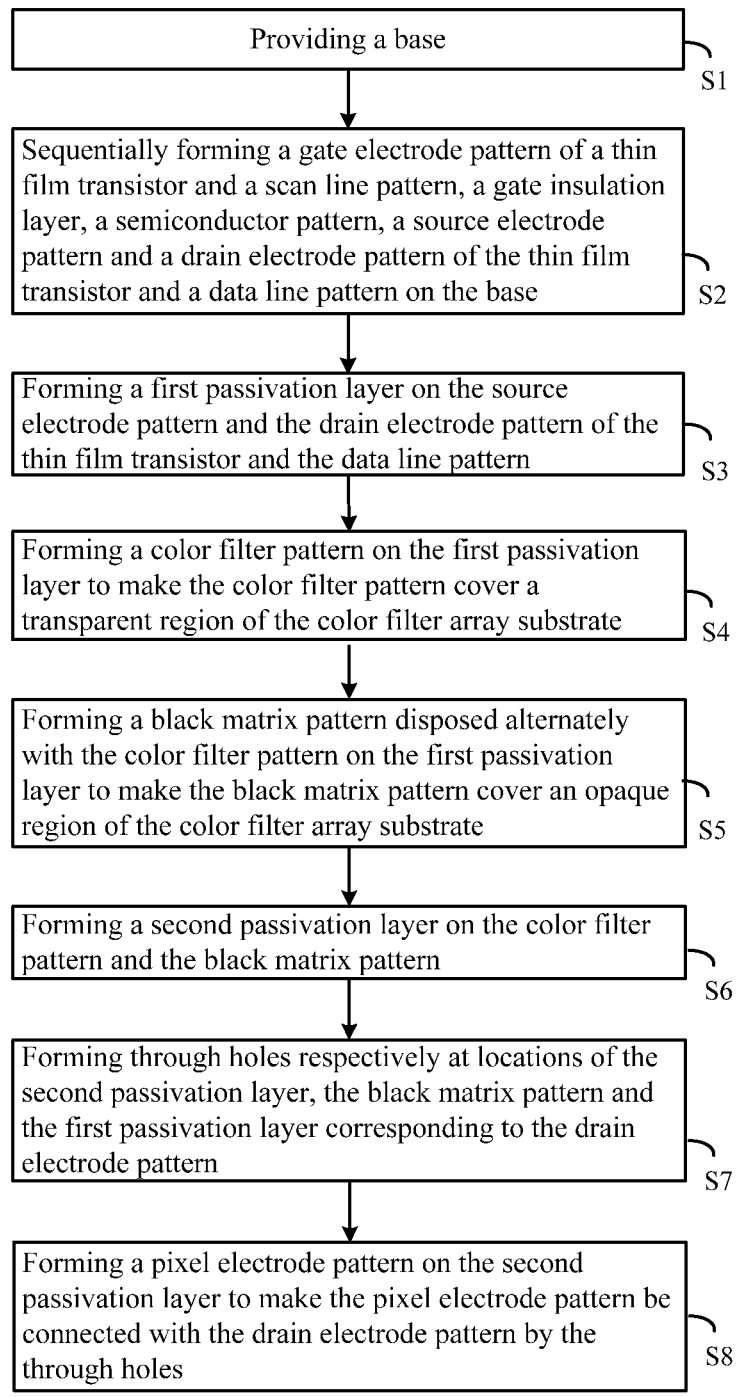
FIG. 5 is a flowchart of an embodiment of a manufacturing method of a color filter array substrate provided by the invention.
Figure 6:
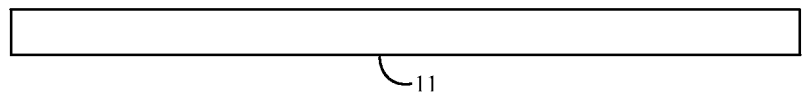
FIG. 6 is a schematic process view of various steps in FIG. 5.
Figure 6:
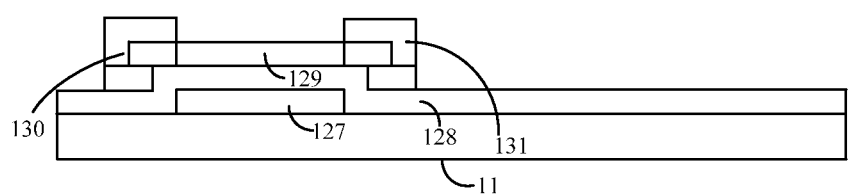
Figure 6:
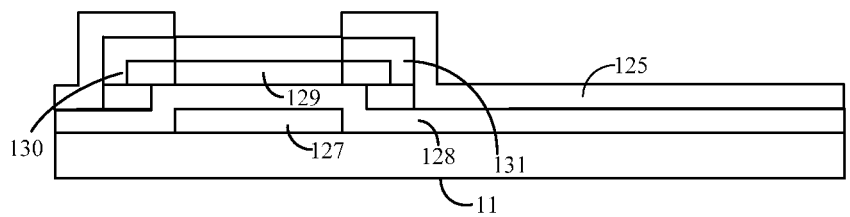
Figure 6:
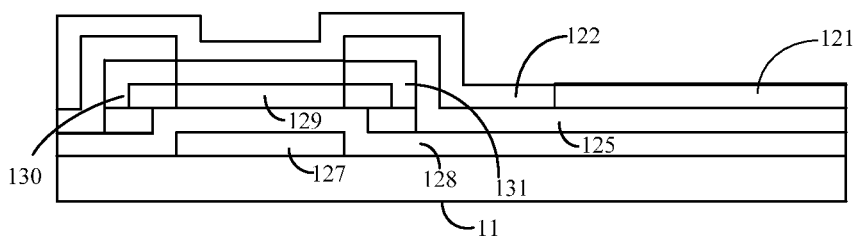
Figure 6:
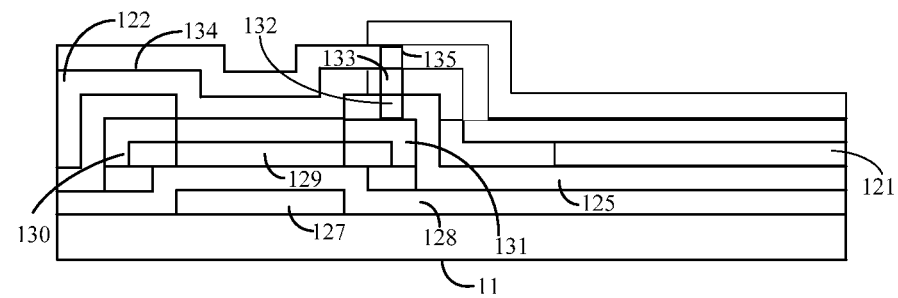

Referring to FIG. 5 and FIG. 6 together, FIG. 5 is a flowchart of an embodiment of a manufacturing method of a color filter array substrate provided by the invention, and FIG. 6 is a schematic process view of various steps in FIG. 5. The manufacturing method of a color filter array substrate provided by the invention is used to produce/manufacture the color filter array substrate 10 shown in FIG. 1, FIG. 2 and FIG. 3, and the same references in the present specification are used to indicate/denote the same or like structural components. As shown in FIG. 5 and FIG. 6, and in conjunction with FIG. 1, FIG. 2 and FIG. 3, the manufacturing method includes the following steps:

S1: providing a base 11.

The base 11 may be a glass base or a plastic base. Furthermore, when the base 11 is provided, the base 11 is processed such as by cleaning or grinding so as to remove impurities on the surface thereof, and optionally a drying process then is employed to dry the base 11, so as to obtain a clean base 11.

S2: sequentially forming a gate electrode pattern 127 of a thin film transistor and a scan line pattern 123 (not shown in FIG. 6, please refer to FIG. 1), a gate insulation layer 128, a semiconductor pattern 129, a source electrode pattern 130 and a drain electrode pattern 131 of the thin film transistor and a data line pattern 124 (not shown in FIG. 6, please refer to FIG. 1) on the base 11.

The gate electrode pattern 127, the source electrode pattern 130 and the drain electrode pattern 131 each are made of a metal material, the scan line pattern 123 and the data line pattern 124 each may be made of a metal material or a transparent conductive material, the gate passivation layer 128 may be made of a silicon oxide material and/or a silicon nitride material, the semiconductor pattern 129 may be made of an amorphous silicon material, and in other embodiment, the semiconductor pattern 129 may be made of a polycrystalline silicon material instead. The step S2 is same as the prior art, and generally mask processes are used to pattern continuous whole layer materials so as to obtain expected patterns of various layers or structural components, and thus they will not be described herein.

Furthermore, when forming the gate electrode pattern 127, the step S2 optionally furthermore forms a common electrode pattern 133c as shown in FIG. 1.

S3: forming a first passivation layer 125 on the source electrode pattern 121 and the drain electrode pattern 130 of the thin film transistor and the data line pattern 124.

The first passivation layer 125 may be formed by a method of deposition or coating. For example, depositing or coating a material of the first passivation layer 125 to form a thin layer by a physical vapor deposition (PVD) apparatus, a chemical vapor deposition (CVD) apparatus or a coating machine. The first passivation layer 125 may be made of a silicon nitride material.

S4: forming a color filter pattern 121 on the first passivation layer 125 to thereby make the color filter pattern 121 cover a transparent region (light-transmissible region) I of the color filter array substrate 10.

A specific implementation method of the step S4 is that: forming a color filter layer on the first passivation layer 125, patterning the color filter layer by a mask process to form the color filter pattern 121. Referring to FIG. 1 and FIG. 3 together, the color filter pattern 121 covers the transparent region (light-transmissible region) I of the color filter array substrate 10, and concretely the color filter pattern 121 is located above the first passivation layer 125 and fully covers the whole transparent region I.

The color filter layer may be a red photoresist material, a green photoresist material or/and a blue photoresist material.

S5: forming a black matrix pattern 122 on the first passivation layer 125 and disposed alternately with the color filter pattern 121 to make the black matrix pattern 122 cover an opaque region II of the color filter array substrate 10.

It should be understood that, a specific implementation method of the step S4 is that: forming a black matrix material layer on the first passivation layer 125 and the color filter pattern 121, and then patterning the black matrix material layer by a mask process to form the black matrix pattern 122, so as to make the black matrix pattern 122 cover the opaque region II of the color filter array substrate 10.

The black matrix pattern 122 is made of an organic photoresist material.

The manufacturing method further includes:

S6: forming a second passivation layer 134 on the color filter pattern 121 and the black matrix pattern 122.

The second passivation layer 134 may have a same formation method as that of the first passivation layer 125. Furthermore, the second passivation layer 134 may be made of a silicon nitride material. The second passivation layer 134 has an effect of enhancing an adhesion of the subsequent pixel electrode pattern 126, so as to make the pixel electrode pattern 126 be stably and securely connected to the drain electrode pattern 131.

S7: forming through holes respectively at locations of the second passivation layer 134, the black matrix pattern 122 and the first passivation layer 125 corresponding to the drain electrode pattern 131.

The step S7 concretely uses a mask process to form the through holes respectively at the locations corresponding to the drain electrode pattern 131, referring to FIG. 2 and FIG. 6 together, the through hole in the first passivation layer 125 is a first through hole 132, the through hole in the black matrix pattern 122 is a second through hole 133, and the through hole in the second passivation layer 134 is a third through hole 135.

In order to facilitate the subsequent connection of the pixel electrode pattern 126, regions of the first through hole 132, the second through hole 133 and the third through hole 135 are not covered with the black matrix material.

S8: forming a pixel electrode pattern 126 on the second passivation layer 134 and making the pixel electrode pattern 126 be electrically connected to the drain electrode pattern 131 via the through holes specifically being the first through hole 132, the second through hole 133 and the third through hole 135.

The pixel electrode pattern 126 may be made of a transparent conductive material.

It should be understood that, the pixel electrode pattern 126 is disposed in the transparent region I and the opaque region II, in the opaque region II it is used to connect with the drain electrode pattern 131, and in the transparent region I it covers the whole transparent region I so as to apply a suitable display grayscale voltage to the liquid crystal layer 43 shown in FIG. 4.

Different from the prior art, the invention forms multiple pixel units arranged in an array on the base of the color filter array substrate, and each pixel unit includes a transparent region and an opaque region located at the periphery of the transparent region, the pixel unit further includes a color filter pattern and a black matrix pattern, the color filter pattern covers the transparent region, the black matrix pattern directly covers the opaque region in the case of no color filter pattern being disposed therebelow. Compared with the prior art, the invention can form a thicker black matrix pattern in the opaque region of the pixel unit so as to prevent the light leakage of the region, brightness of dark state for subsequent display can be reduced and contrast can be increased, so that the display quality can be improved as a result.

The foregoing discussion only is some preferred embodiments of the invention, it should be noted that, for ordinary skill in the art, under the premise of without departing from the principle of the invention, several modification and variations can be made, and these modifications and variations should be included in the protection scope of the invention.

What is claimed is:

1. A color filter array substrate comprising a base, and a plurality of pixel units arranged in an array on the base; each of the plurality of pixel units comprising a transparent region and an opaque region located at the periphery of the transparent region, each of the plurality of pixel units further comprising a color filter pattern and a black matrix pattern; wherein the color filter pattern covers the transparent region, the black array pattern directly covers the opaque region and the color filter pattern is not disposed therebelow;

wherein each of the plurality of pixel units further comprises a thin film transistor, a scan line pattern, a data line pattern, a first passivation layer and a pixel electrode pattern; a gate electrode pattern and a drain electrode pattern of the thin film transistor respectively are connected with the scan line pattern and the data line pattern, the pixel electrode pattern is located above the first passivation layer, the first passivation layer is disposed with a first through hole, the drain electrode pattern of the thin film transistor is connected with the pixel electrode pattern by the first through hole, the black matrix pattern is disposed corresponding to the thin film transistor, the scan line pattern and the data line pattern and directly in contact with the first passivation layer.

2. The color filter array substrate as claimed in claim 1, wherein the black matrix pattern is made of an organic photoresist material.

3. The color filter array substrate as claimed in claim 1, wherein the black matrix pattern is disposed above the first passivation layer.

4. The color filter array substrate as claimed in claim 3, wherein the black matrix pattern further is disposed with a second through hole at a location thereof corresponding to the first through hole to thereby facilitate the drain electrode pattern of the thin film transistor to be connected with the pixel electrode pattern by the first through hole and the second through hole.

5. The color filter array substrate as claimed in claim 4, wherein each of the plurality of pixel units further comprises a second passivation layer, the second passivation layer is located between the black matrix pattern and the pixel electrode pattern, the second passivation layer is disposed with a third through hole to facilitate the drain electrode pattern of the thin film transistor to be connected with the pixel electrode pattern by the first through hole, the second through hole and the third through hole.

6. The color filter array substrate as claimed in claim 1, wherein the black matrix pattern is disposed between the first passivation layer and the base.

7. A display device comprising a color filter array substrate, the color filter array substrate comprising a base and a plurality of pixel units arranged in array on the base, each of the plurality of pixel units comprising a transparent region and an opaque region located at the periphery of the transparent region, each of the plurality of pixel units further comprising a color filter pattern and a black matrix pattern; wherein the color filter pattern covers the transparent region, the black array pattern directly covers the opaque region in the case of no the color filter pattern being disposed therebelow;

wherein each of the plurality of pixel units further comprises a thin film transistor, a scan line pattern, a data line pattern, a first passivation layer and a pixel electrode pattern; a gate electrode pattern and a drain electrode pattern of the thin film transistor are connected with the scan line pattern and the data line pattern respectively, the pixel electrode pattern is located above the first passivation layer, the first passivation layer is disposed with a first through hole, the drain electrode pattern of the thin film transistor is connected with the pixel electrode pattern by the first through hole, the black matrix pattern is disposed corresponding to the thin film transistor, the scan line pattern and the data line pattern and directly in contact with the first passivation layer.

8. The display device as claimed in claim 7, wherein the black matrix pattern is made of an organic photoresist material.

9. The display device as claimed in claim 7, wherein the black matrix pattern is disposed above the first passivation layer.

10. The display device as claimed in claim 9, wherein the black matrix pattern further is disposed with a second through hole at a location thereof corresponding to the first through hole to facilitate the drain electrode pattern of the thin film transistor to be connected with the pixel electrode pattern by the first through hole and the second through hole.

11. The display device as claimed in claim 10, wherein each of the plurality of pixel units further comprises a second passivation layer, the second passivation layer is located between the black matrix pattern and the pixel electrode pattern, the second passivation layer is disposed with a third through hole to facilitate the drain electrode pattern of the thin film transistor to be connected with the pixel electrode pattern by the first through hole, the second through hole and the third through hole.

12. The display device as claimed in claim 7, wherein the black matrix pattern is disposed between the first passivation layer and the base.

13. A manufacturing method of a color filter array substrate, comprising following steps of:
providing a base;
sequentially forming a gate electrode pattern of a thin film transistor and a scan line pattern, a gate insulation layer, a semiconductor pattern, a source electrode pattern and a drain electrode pattern of the thin film transistor and a data line pattern on the base;
forming a first passivation layer on the source electrode pattern and the drain electrode pattern of the thin film transistor and the data line pattern;
forming a color filter pattern on the first passivation layer to make the color filter pattern cover a transparent region of the color filter array substrate;
forming a black matrix pattern disposed alternately with the color filter pattern on the first passivation layer to make the black matrix pattern cover an opaque region of the color filter array substrate.

14. The manufacturing method as claimed in claim 13, further comprising following steps of:
forming a second passivation layer on the color filter pattern and the black matrix pattern;
forming through holes respectively at locations of the second passivation layer, the black matrix pattern and the first passivation layer corresponding to the drain electrode pattern;
forming a pixel electrode pattern on the second passivation layer to make the pixel electrode pattern be connected with the drain electrode pattern by the through holes.

* * * * *